United States Patent [19]

Eguchi

[11] Patent Number: 6,064,182
[45] Date of Patent: May 16, 2000

[54] BATTERY PACK, BATTERY REMAINING CAPACITY DETECTION METHOD, AND APPLICATION DEVICE DRIVEN WITH BATTERY PACK AS POWER SOURCE

[75] Inventor: Yasuhito Eguchi, Kanagawa, Japan

[73] Assignee: Sony Corporation, Tokyo, Japan

[21] Appl. No.: 09/095,553

[22] Filed: Jun. 11, 1998

[30] Foreign Application Priority Data

Jun. 13, 1997 [JP] Japan .................................. 9-156706

[51] Int. Cl.[7] .................................................. H01M 10/44
[52] U.S. Cl. ........................... 320/132; 324/427; 429/91; 429/93
[58] Field of Search ........................ 429/90–93; 320/132; 324/427, 428

[56] References Cited

U.S. PATENT DOCUMENTS

| | | | |
|---|---|---|---|
| 4,876,513 | 10/1989 | Brilmyer et al. | 324/427 |
| 5,592,094 | 1/1997 | Ichikawa | 324/427 |
| 5,761,072 | 6/1998 | Bardsley, Jr. et al. | 364/483 |

*Primary Examiner*—Maria Nuzzolillo
*Assistant Examiner*—Jonathan Crepeau
*Attorney, Agent, or Firm*—Hill & Simpson

[57] ABSTRACT

A capacity detection method for use with a secondary battery is provided which is capable of accurately detecting capacity by a voltage method by taking into consideration the polarization characteristics of a secondary battery, such as a lithium-ion secondary battery. When the capacity of a secondary battery is to be detected, this capacity detection method uses a voltage method in which the voltage of a secondary battery is measured and the capacity of the secondary battery is computed on the basis of the correlation between the voltage and the capacity of the secondary battery. A voltage and capacity correlation table of the secondary battery is prepared. The voltage of the secondary battery in the correlation table is adjusted by taking the polarization characteristics into consideration, and the capacity of the secondary battery is detected on the basis of the adjusted voltage of the secondary battery. The polarization characteristics are obtained by using a moving average of a current value of the battery.

11 Claims, 7 Drawing Sheets

| DBV | VOLTAGE (FOR ADJUSTMENT) FOR REFERRING TO CORRELATION TABLE |
|---|---|
| Dia | MOVING AVERAGE OF CURRENT (FOR ADJUSTING VOLTAGE BY AN AMOUNT CORRESPONDING TO POLARIZATION) |
| DI | STEADY-STATE CURRENT |
| VDm | STEADY-STATE VOLTAGE |
| DVdm | VOLTAGE DROP WHEN INFLUENCE OF POLARIZATION CEASES |
| DVd | ADJUSTMENT VALUE (VOLTAGE) |
| Vp | POLARIZATION VOLTAGE |
| rr | INTERNAL PURE RESISTANCE OF SECONDARY BATTERY |
| DV | TERMINAL VOLTAGE (CELL VOLTAGE) |
| N | PROPORTIONAL CONSTANT (POLARIZATION VOLTAGE / DROP OF VOLTAGE CORRESPONDING TO INTERNAL RESISTANCE) |
| DBT | VOLTAGE (REFERENCE VOLTAGE FOR ADJUSTMENT) FOR REFERRING TO CORRELATION TABLE |

BATTERY PACK, BATTERY REMAINING CAPACITY DETECTION METHOD, AND APPLICATION DEVICE DRIVEN WITH BATTERY PACK AS POWER SOURCE

BACKGROUND OF THE INVENTION

1. Field of the Invention

The present invention relates to a battery remaining detection method for detecting the remaining capacity of a battery, such as a lithium-ion secondary battery.

2. Description of the Related Art

The remaining capacity of a secondary battery, such as a lithium-ion secondary battery, has hitherto been estimated from the terminal voltage of the battery. That is, as a method of detecting the remaining capacity of a secondary battery, a voltage method has been proposed. This voltage method is a method of measuring the voltage of a secondary battery and computing the capacity of the secondary battery on the basis of the correlation between the voltage and the capacity of the secondary battery.

In a secondary battery, such as a lithium-ion secondary battery, when the capacity is estimated using the voltage method, the remaining voltage is estimated from the terminal voltage of the secondary battery by using the voltage–capacity correlation table of the lithium-ion secondary battery. A voltage drop is computed on the basis of the current and the internal resistance of the secondary battery, and conversion into the capacity is performed.

In the above-described voltage method, however, as a typical problem, an accurate capacity cannot be obtained at a change point of current, for example, a discharge start point or a charging start point. This is because there is a polarization voltage due to the polarization characteristics of the secondary battery. When discharge current begins to flow, a large capacity of the secondary battery appears because of the influence of the polarization voltage, and there is a difference in voltage drop between the time immediately after (at the time discharge starts) the current is changed and a time after some time has elapsed (e.g., 10 minutes). Therefore, if the capacity of the secondary battery is estimated on the basis of the voltage–capacity correlation table of the secondary battery by ignoring the polarization characteristics of the secondary battery, the error of the capacity appears to be large when the current is changed.

SUMMARY OF THE INVENTION

Accordingly, an object of the present invention is to provide a remaining capacity detection method for use with a secondary battery, which solves the above-described problems and which is capable of accurately detecting the capacity by a voltage method by taking into consideration the polarization characteristics of a secondary battery, such as a lithium-ion secondary battery.

To achieve the above-described object, according to the present invention, there is provided a battery remaining capacity detection method comprising the steps of: a battery voltage detection step of detecting the voltage of a battery; a battery voltage adjustment step of adjusting the detected voltage on the basis of the polarization characteristics possessed by a battery, and obtaining the adjusted battery voltage; and a battery capacity detection step of determining the capacity of the battery from the adjusted battery voltage on the basis of the correlation between the voltage of the battery and the capacity of the battery.

In the present invention, a voltage and capacity correlation table of a secondary battery is prepared. The voltage of the secondary battery in the correlation table is adjusted by taking the polarization characteristics into consideration, and the capacity of the secondary battery is detected on the basis of the adjusted voltage of the secondary battery.

As a result of taking the polarization characteristics into consideration, the change in the voltage at the change point of current, when discharge current and charging current begins to flow, is adjusted, and the capacity can be accurately detected on the basis of the voltage and capacity correlation table of the secondary battery.

In the present invention, preferably, in order to take the polarization characteristics into consideration, the relationship between the hysteresis of current and the polarization voltage is measured, and a table or the like for each condition is referred to. A moving average of a current value is used as the hysteresis of current and is approximated, thus the change in the polarization voltage regarding the polarization characteristics can be obtained.

The above and further objects, aspects and novel features of the invention will become more apparent from the following detailed description when read in connection with the accompanying drawings.

DETAILED DESCRIPTION OF THE PREFERRED EMBODIMENTS

The preferred embodiments of the present invention will be described below in detail with reference to the accompanying drawings.

Since the embodiments to be described below are preferred specific examples of the present invention, various technically preferred limitations are imposed thereon. However, the scope of the present invention is not limited to these embodiments unless a description particularly limiting the present invention is provided in the following.

Figure 1:
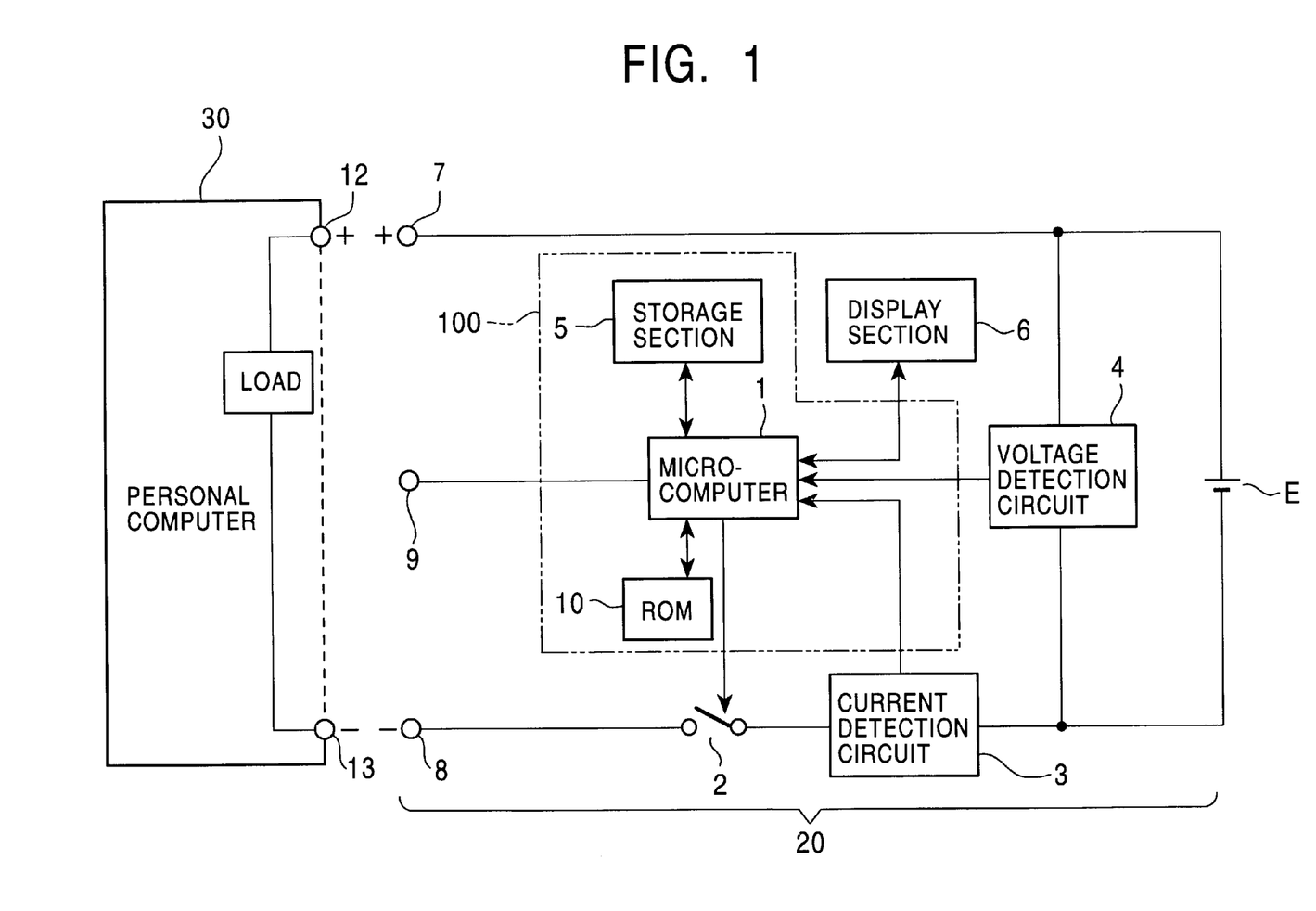
FIG. 1 shows an example of a circuit for performing a method of detecting the remaining capacity of a secondary battery according to the present invention.

Shown in FIG. 1 are a battery pack (a pack of a secondary battery E) 20 for performing a method of detecting the remaining capacity of a secondary battery of the present invention, and a computer 30 as an example of an electronic apparatus to which this battery pack 20 is loaded. This computer 30 is, for example, a portable personal computer, to which the battery pack 20 can be removably loaded. By supplying power from this battery pack 20, the computer 30 operates.

Referring to FIG. 1, the construction of this battery pack 20 is described further. This battery pack (a pack of a secondary battery) 20 includes a voltage detection circuit 4, which is voltage detection means, a current detection circuit 3, control means 100, and a display section 6.

The control means 100 includes a microcomputer 1, a storage section 5, and a read only memory (hereinafter ROM) 10. This microcomputer 1 comprises a communication terminal 9.

The voltage detection circuit 4, which is voltage detection means, detects the terminal voltage of the secondary battery E in order to compute the capacity of the secondary battery E on the basis of the correlation between the voltage and the capacity of the secondary battery E. The current detection circuit 3 accumulates the current value of the secondary battery E with time, and detects the current value of the secondary battery E in order to compute the capacity of the secondary battery E.

The control means 100 is able to switch between an operation for computing the capacity of the secondary battery E on the basis of the correlation between the voltage and the capacity of the secondary battery E and an operation for computing the capacity of the secondary battery E by accumulating the current value of the secondary battery E with time, for example, with a preset current value or a preset voltage-drop value as a start point.

Figure 2A:
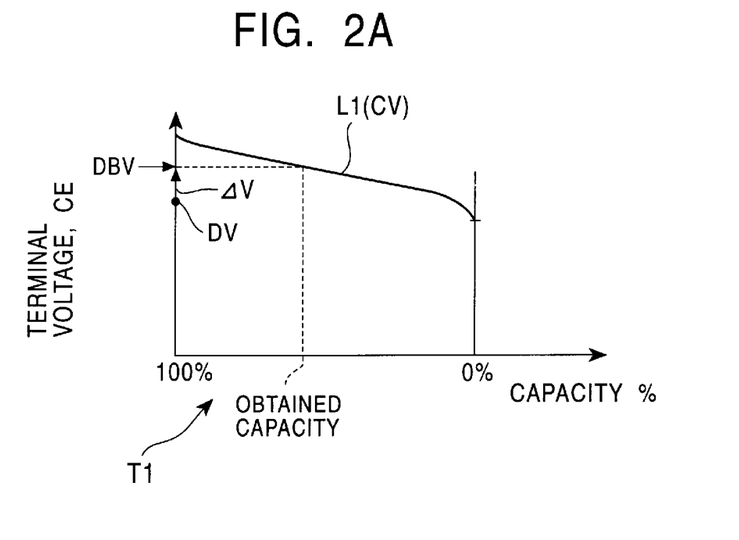
FIGS. 2A, 2B, and 2C show examples of a voltage–capacity correlation table for use in the embodiment of the remaining capacity detection method of the present invention.

Referring to FIG. 2A, an example will be given of the relationship between the cell voltage, which is the terminal voltage of the secondary battery E to be detected by the voltage detection circuit 4, and the capacity % of the secondary battery E. In the voltage –capacity correlation table T1 of FIG. 2A, the cell voltage CE is given on the vertical axis, and the capacity % is given on the horizontal axis. As the cell voltage CE decreases almost linearly, the capacity % of the secondary battery E decreases with a particular correlation. There is a voltage value at which the cell voltage CE decreases sharply.

The microcomputer 1 is able to compute capacity % on the basis of the voltage–capacity correlation table T1 of FIG. 2A, and the detected voltage value of the cell voltage CE obtained by the voltage detection circuit 4.

The battery pack 20 monitors the state (for example, the voltage of the secondary battery E, charging/discharging current, the remaining capacity, and so on) of the secondary battery E and performs communication with a charging unit (not shown) or a load such as the computer 30, for example, with the microcomputer 1 for monitoring the battery being contained therein. The display section 6 of such a battery pack 20 displays the state of the secondary battery E transmitted from the microcomputer 1, thereby notifying the user.

The secondary battery E contained within the battery pack 20 is, for example, a lithium-ion-type secondary battery. A +terminal 12 thereof is connected to a +terminal 7 of the pack (the package of the battery pack 20), and a –terminal 13 is connected to a –terminal (GND terminal) 8 of the pack on the current detection circuit 3 and the switch 2 side. Therefore, the discharge current of the secondary battery E is supplied to the computer 30 via the +terminals 7 and 12, and the –terminals 8 and 13. When the battery pack 20 is charged, the charging current flows to the secondary battery E via the +terminal 7 and the –terminal 8.

The microcomputer 1 is, for example, a CPU (central processing unit), which cyclically receives the output of the current detection circuit 3 or the voltage detection circuit 4, thus detecting the current (the discharging current and the charging current) flowing through the secondary battery E or the voltage of the secondary battery E, in cycles. The microcomputer 1 controls the switch 2, which is normally on, on the basis of the voltage and the current so that this is turned off, and current (the charging current or the discharging current) is shut out, preventing an overcharge, overdischarge, and overcurrent.

The microcomputer 1, as described above, determines the currently remaining capacity of the secondary battery E on the basis of the detected voltage of the secondary battery E.

The microcomputer 1 is connected to a communication terminal 9 of the pack, and performs communication with the computer 30 in accordance with a predetermined communication procedure via this communication terminal 9. The microcomputer 1 performs a predetermined process in accordance with data (command) transmitted via the communication terminal 9, and transmits the battery voltage, the charging/discharging current, the remaining capacity of the secondary battery E, the accumulated capacity, and the like to the computer 30 via the communication terminal 9.

As the secondary battery E, for example, a lithium-ion secondary battery is used. Between the terminal voltage (called an open voltage or cell voltage) and the capacity of the secondary battery E, there is the above-described voltage–capacity correlation table T1 shown in FIG. 2A. When the cell voltage is known, the remaining capacity (represented by capacity %) can be determined.

The switch 2 of FIG. 1 is switched under the control of the microcomputer 1, thereby turning on/off the charging current and the discharging current. The current detection circuit 3 detects the current flowing therethrough, that is, the discharging current of the secondary battery E and the charging current for the secondary battery E, and supplies it to the microcomputer 1. A storage section 5 is formed of a register for storing, for example, the value of the accumulated capacity and the like. The display section 6 (display means) is formed of, for example, a liquid-crystal display device, and the like, and displays the accumulated capacity, and other information under the control of the microcomputer 1.

In a ROM (read only memory) 10 of FIG. 1, programs and data required for the operation of the microcomputer 1 have been stored. The microcomputer 1 executes a program stored in the ROM 10 while referring to the data stored in this ROM 10 as required, thus performing various processing.

When the battery pack 20 constructed as described above is normally loaded into the computer 30, the +terminal 7, the –terminal 8, and the communication terminal 9 are electrically connected to the computer 30. The computer 30 operates by using the battery pack 20 as a power-source unit. In this case, the discharging current of the secondary battery E flows along the path of the +terminal 7, the computer 30, and the –terminal 8.

In the battery pack 20, the current (discharging current, charging current) flowing through the secondary battery E or the voltage thereof is detected by the current detection circuit 3 or the voltage detection circuit 4, respectively, and the current value and the voltage value are cyclically received by the microcomputer 1. The microcomputer 1 determines whether or not the secondary battery E is in an overcharged, overdischarged, or overcurrent state on the basis of this current value or this voltage value. When the secondary battery E is in an overcharged, overdischarged, or overcurrent state, the switch 2 is turned off so that the current (charging current, discharging current) is shut out.

The microcomputer 1 computes the present capacity (the remaining capacity of the secondary battery E) on the basis of the detected voltage value of the secondary battery E and the voltage –capacity correlation table T1 of FIG. 2A, and computes the accumulated capacity while referring to the storage section 5 as required on the basis of the present capacity.

The microcomputer 1 transmits the accumulated capacity computed as described above, the current value supplied from the current detection circuit 3, and the voltage value supplied from the voltage detection circuit 4 in accordance with a request from the computer 30 via the communication terminal 9. Also, the microcomputer 1 supplies the determined accumulated capacity to the display section 6, whereby it is displayed thereon.

Next, a description will be given of a preferred embodiment of a remaining capacity detection method for use with a secondary battery of the present invention in the voltage method.

FIG. 2A shows the correlation table T1 which shows the relationship between the terminal voltage (the cell voltage as a terminal voltage in a no-load state) CE of the secondary battery of FIG. 1, and the capacity % corresponding to the cell voltage CE. That is, a correlation line L1 (a no-load curve CV) of the correlation table T1 of the cell voltage CE and the capacity % in FIG. 2A shows the correlation of the capacity versus terminal voltage during no load.

Figure 2B:
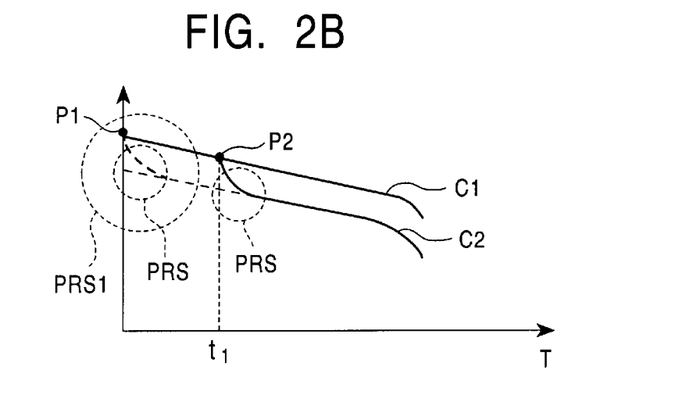

In the correlation table of FIG. 2B, a case in which there is polarization is shown, points P1 and P2 of a curve C1 indicate a voltage before current is made to flow, and a curve C2 indicates a voltage when current is flowing. A portion PRS surrounded by a circle of a broken line indicates a bent portion of the curve due to polarization. Point P1 indicates the time when current is made to flow from the beginning (in a 100% charged state), and point P2 indicates a time t1 when current is made to flow from halfway (charged up to halfway or discharged up to halfway, and left for some time).

Figure 2C:
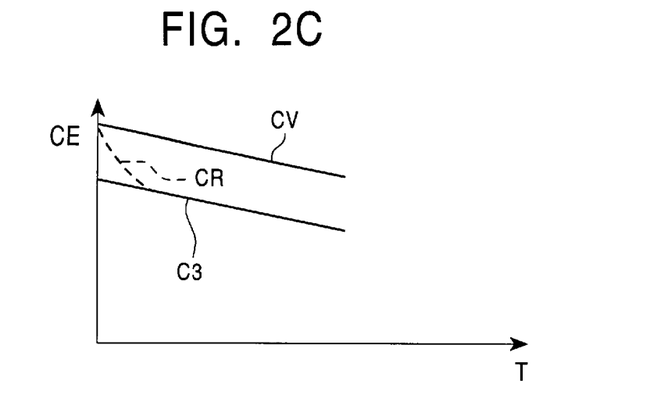

FIG. 2C shows an enlargement of a portion RPS1 of FIG. 2B, also showing an actual discharge curve CR due to the influence of polarization and a discharge curve C3 when it is assumed that there is no polarization.

In order to reduce the direct error of the voltage method, the no-load curve CV of the correlation table T1 of capacity versus terminal voltage of FIG. 2A is used. However, since the terminal voltage (cell voltage) of the secondary battery varies due to the magnitude of the current value and a voltage drop due to internal resistance and the like, the voltage value does not necessarily indicate capacity % as it is.

Therefore, the measured voltage DV of FIG. 2A is adjusted by a current DI which flows at that time and an internal resistance R of the battery, the voltage during no load is determined, and the table of FIG. 2A is referred to. However, when polarization characteristics are present, in this voltage method, an accurate capacity cannot be obtained at a current change point, for example, a discharge start point. This is because there is a polarization voltage due to the polarization characteristics of the secondary battery. In the voltage drop during the time of, for example, about 10 minutes, from the start of discharge, the voltage differs between the time immediately after (at the time discharge starts) the current is varied and a time after some time has elapsed. Therefore, when the capacity of the secondary battery is estimated merely on the basis of the voltage–capacity correlation table of the secondary battery without taking the polarization characteristics of the secondary battery into account, the error of the capacity appears to be large at the time when the current is varied.

Therefore, the preferred embodiment of the present invention makes it possible to accurately determine capacity at a discharge or charging start time by computing the capacity from the voltage by referring to, for example, the correlation table T1 of FIG. 2A by taking into consideration the polarization voltage due to the discharge (or charging) current of the secondary battery.

Also, since the polarization voltage varies due to a change in the current, the moving average of current is computed so that it corresponds to the time constant of polarization and the measured voltage is adjusted by the moving average of the current, thereby accurately determining the capacity. That is, the influence of the polarization characteristics in the secondary battery E is considered to be not due to the change in the polarization resistance, but due to the change in a polarization voltage Vp. The reason for this is that even if the current becomes zero amperes, the polarization voltage Vp is present. Since the polarization voltage Vp varies due to the hysteresis of current, the moving average Dia of current of FIG. 3B is used as the hysteresis of current.

The preferred embodiment of such a remaining capacity detection method will be described below in detail.

Thus, the correlation line L1 in the correlation table T1 of FIG. 2A indicates the state during no load in which no load is connected to the secondary battery E.

Assuming that the internal resistance of the secondary battery E is constant (in practice, slightly differs between near the full charge and near the discharge termination, but an error due to this can be adjusted by adjusting data of the correlation table. However, since this adjustment is an adjustment at the time of a "particular load", in the case of a load deviated from the "particular load", an error corresponding to the amount of deviation occurs), a voltage DBV in the correlation table T1 can be obtained on the basis of the following equation (1):

$$DBV=DV+IR \tag{1}$$

where DBV is the voltage (for referring to the correlation table) accumulated by the table current×internal resistance, DV is the measured terminal voltage, IR corresponds to $\Delta V$, I is the current, and R is the internal resistance of the secondary battery E.

Since this internal resistance R varies due to temperature and other factors, adjustment is necessary. The accuracy of the adjustment of the internal resistance R affects the direct error of the capacity, but a description thereof has been omitted here.

In this remaining capacity detection method, the terminal voltage of the secondary battery E is converted into a "terminal voltage during no load", but this can also be converted into a "terminal voltage during a particular load". When this "terminal voltage during a particular load" is used, the current value of equation (1) described above is set so that $I=Iz-Ix$, and a correlation table T1 during the load of Ix must be prepared. Iz is the value of the current flowing at that time.

In the case of a method which uses a correlation table, if the voltage is converted into a "terminal voltage during no load" or converted into a "terminal voltage during a particular load", exactly the same result can be obtained.

Figure 3A:
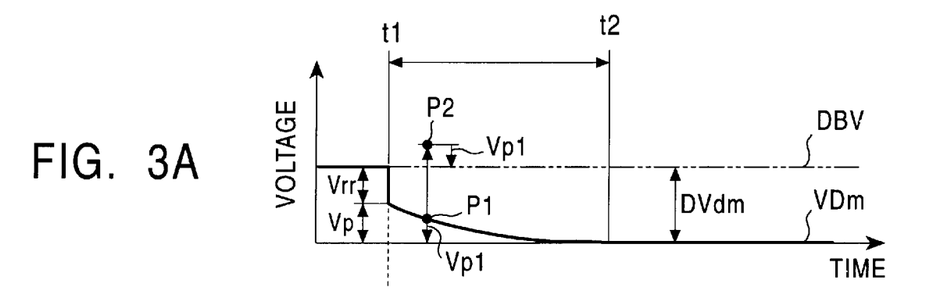
FIGS. 3A and 3B illustrate examples in which a voltage for referring to a correlation table is adjusted in an amount corresponding to the polarization voltage in the remaining capacity detection method of FIGS. 3A and 3B.
Figure 3B:
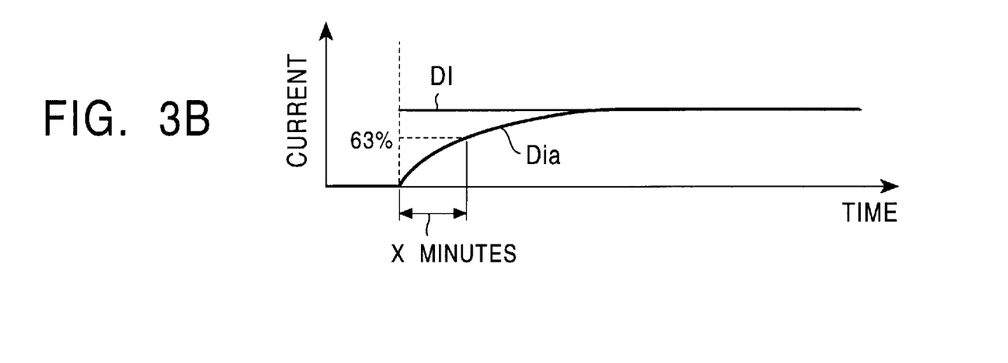

In FIG. 3A, voltage is plotted along the vertical axis, and time is plotted along the horizontal axis. In FIG. 3B, current is plotted along the vertical axis, and time is plotted along the horizontal axis. Shown in FIGS. 3A and 3B are a voltage drop Vrr due to internal resistance rr, a polarization voltage Vp, the moving average Dia of current, a voltage drop DVdm after being stabilized, and so on. FIGS. 3A and 3B show that the reference voltage DBV for referring to the correlation table is determined by adjusting it in an amount corresponding to the polarization voltage. That is, in the examples of FIGS. 3A and 3B, the terminal voltage itself of the secondary battery E to be referred to in the correlation table T1 in FIG. 2A is adjusted by using the polarization voltage Vp.

A time t1 in FIG. 3A indicates that the switch 2 of the secondary battery E of FIG. 1 is turned on and the use of the secondary battery E is begun. A time t2 indicates the time elapsed, for example, about 10 minutes from time t1, also showing that the use of the secondary battery E has begun from time t1, at time t2, the polarization voltage Vp is almost not present (I*rr is stabilized), and the voltage drop Vrr due to the internal resistance is stabilized to the voltage drop DVdm and becomes a steady-state voltage VDm after stabilization.

Meanwhile, when the use of the secondary battery E is begun at time t1, the moving average Dia of current such that a predetermined sample range is used and the values of this range are averaged increases gradually in comparison with the current DI of the steady state. Since the state in which this moving average Dia of current is increased gradually corresponds to a decrease in the polarization voltage Vp, it is possible to estimate the polarization voltage Vp on the basis of this moving average Dia of current. X minutes in FIG. 3B indicates a time constant (number of samples× sample cycle) of the moving average, for example, 3 minutes, and the moving average Dia of current is a value which is about 63% with respect to the steady-state current DI.

The polarization voltage Vp becomes:

$$\text{Polarization voltage } Vp = Dia \times rp \quad (2)$$

In this equation (2), rp is an amount corresponding to the polarization-equivalent resistance (varies with temperature and current).

The voltage drop DVdm, when the influence of polarization in the steady state ceases, occurs after t2 in FIG. 3A, and this voltage drop DVdm can be expressed by equation (3) below:

$$DVdm = DI \times rr + Dia \times rp \quad (3)$$

In this equation (3), rr indicates an amount corresponding to the internal pure resistance of the secondary battery.

Assuming that the percentage of rr and rp is constant, $$rp = rr \times N \text{ (N is a proportional constant)} \quad (4)$$

Since only the voltage drop DVdm, when the influence of polarization ceases, needs to be adjusted:

$$\text{Voltage } DVd \text{ to be adjusted} = DI \times rr + Dia \times rp = DI \times rr + Dia \times rr \times N = (DI + Dia \times N) \times rr \quad (5)$$

The reference voltage DBV for referring to the correlation table of FIG. 2A becomes equation (6) because this voltage DVd to be adjusted need only be added to the measured terminal voltage DV:

$$\text{Reference voltage DBV for the correlation table} = DV + DVd = DV + (DI + Dia \times N) \times rr \quad (6)$$

where
  DBV is the voltage for referring to the correlation table,
  DV is the terminal voltage of the secondary battery,
  DI is the current during no load,
  Diameter is the moving average of current,
  N is the proportional constant (polarization voltage/drop of voltage by an amount corresponding to internal resistance), and
  rr is the internal pure resistance of the secondary battery.

Figure 4:
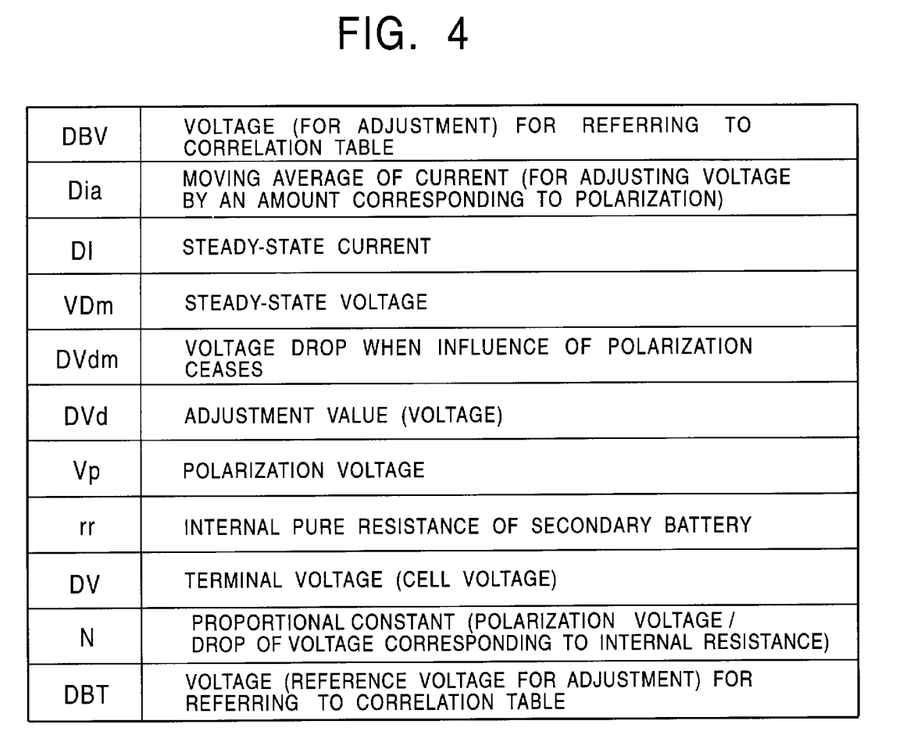
FIG. 4 defines the abbreviations in FIGS. 3A and 3B.

The definitions of the abbreviations in each of the above-described equations are also shown in FIG. 4.

In the remaining capacity detection method for use in a secondary battery in FIGS. 3A and 3B, the voltage DBV for referring to the correlation table T1 of FIG. 2A is used to adjust an amount corresponding to the polarization voltage Vp. Since the polarization voltage Vp varies in accordance with the moving average Dia of current, the polarization voltage Vp is determined by using the movement of this moving average Dia of current.

In the case in which the voltage of the secondary battery E at the time, for example, 2 minutes from when the switch 2 of FIG. 1 was turned on and the use of the secondary battery E of FIG. 3A was begun, the voltage value of point P2 containing the voltage value of point P1 on the curve of the voltage drop Vrr due to the internal resistance is detected by the voltage detection circuit 4 of FIG. 1. The value of this point P1 is a value such that a polarization voltage Vp1 is added. Therefore, by subtracting the amount corresponding to the polarization voltage Vp1 from the voltage value of point P2, an accurate voltage DBV for referring to the correlation table can be obtained.

Use of this obtained DBV makes it possible to obtain an accurate capacity % in the correlation table T1 of FIG. 2A.

As described above, the embodiment of the above-described remaining capacity detection method is a remaining capacity detection method which uses a voltage method in which the capacity of a secondary battery is computed on the basis of the correlation between the voltage and the capacity of a secondary battery by measuring the voltage of the secondary battery when the capacity of the secondary battery is to be detected. A correlation table of the voltage and the capacity of a secondary battery is prepared. The voltage of the secondary battery in the correlation table is adjusted by taking the polarization characteristics into consideration, and the capacity of the secondary battery is detected on the basis of the adjusted voltage of the secondary battery. That is, using equation (6) such that the change of the polarization voltage obtained from the moving average of the current value is taken into consideration, the correlation table of the voltage versus capacity of the secondary battery with no load is referred to on the basis of the obtained voltage DBV.

Next, another embodiment of a remaining capacity detection method for use with a secondary battery according to the present invention will be described.

FIGS. 5 to 8 illustrate the other embodiment of a remaining capacity detection method for use with a secondary battery.

Figure 5:
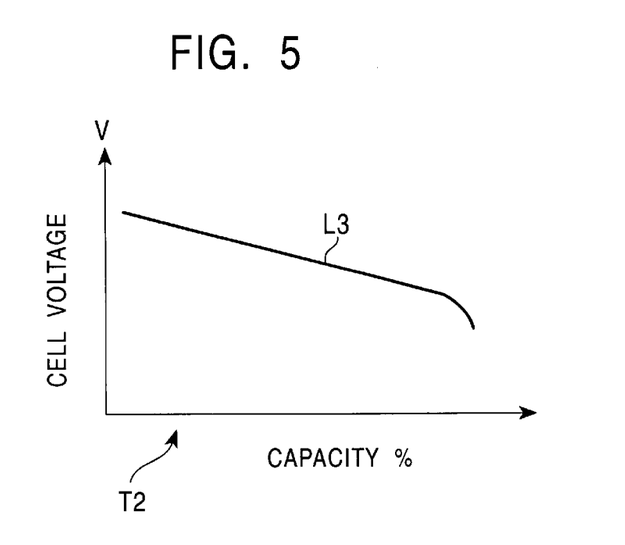
FIG. 5 shows an example of a correlation table for use in another embodiment of a method of detecting the remaining capacity of a secondary battery according to the present invention.

FIG. 5 shows a correlation table T2 of capacity–voltage similar to FIG. 2A. In this correlation table T2, a correlation line L3 is depicted in typical form.

Figure 8:
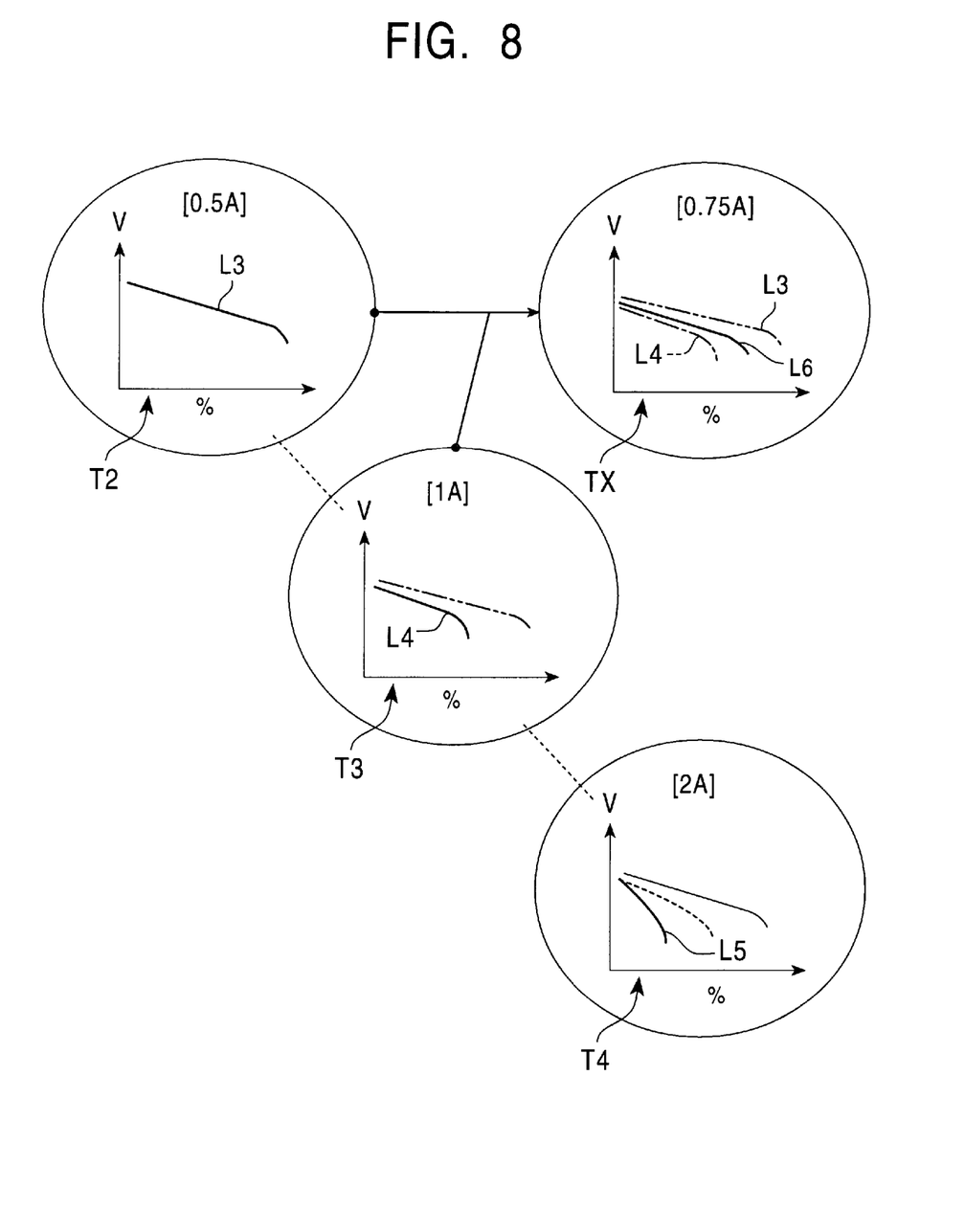
FIG. 8 shows an example of a plurality of correlation tables for use in the remaining capacity detection method shown in FIGS. 6A and 6B.

In this correlation table T2, as shown in FIG. 8, a plurality of different current values of a secondary battery E are set in advance in the form of, for example, three correlation tables T2, T3 and T4 according to each current value. A correlation line L3 is depicted in the correlation table T2, a correlation line L4 is depicted in the correlation table T3, and a correlation line L5 is depicted in the correlation table T4.

In the correlation tables of FIGS. 5 and 8, each of the correlation lines L3, L4, and L5 for each current value is depicted assuming that an amount corresponding to the polarization voltage Vp corresponding to the moving average Dia of current is not present beforehand. Each correlation table is made in advance by taking current×an amount corresponding to internal resistance into consideration. In this point, the correlation tables of FIGS. 5 and 8 are different from the correlation table T1 of FIG. 2A.

Figure 6A:
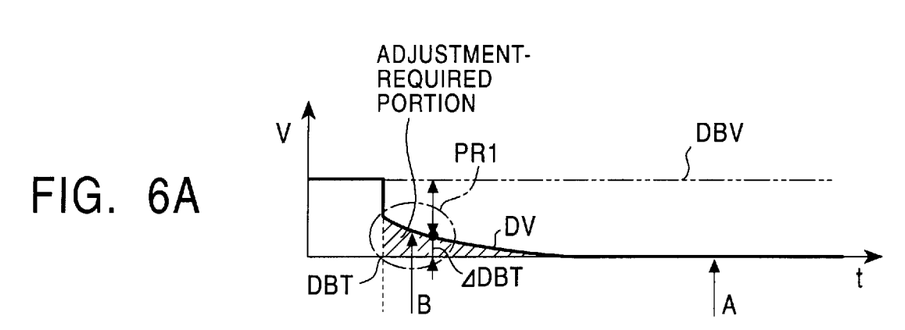
FIGS. 6A and 6B show the other embodiment of a remaining capacity detection method of the present invention, also showing an example in which a voltage for reference when referring to a plurality of reference tables is computed.
Figure 6B:
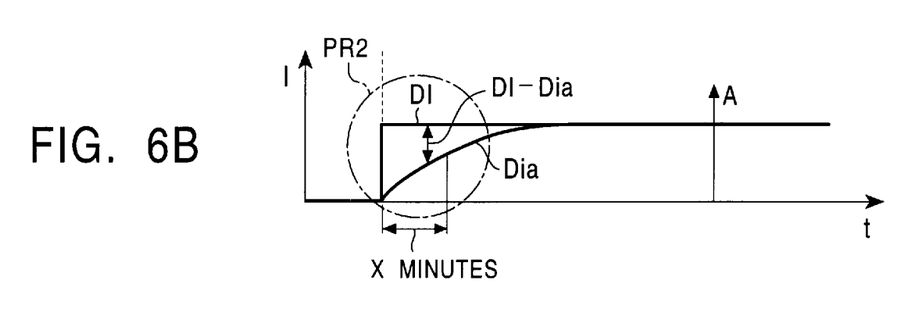

FIGS. 6A and 6B show an example of a remaining capacity detection method in the case where the correlation tables of FIGS. 5 and 8 are used. Shown in FIGS. 6A and 6B are a reference voltage DBT for referring to a correlation table, a moving average Dia of current, a current DI in the steady state, a voltage drop DV, and so on.

Figure 7A:
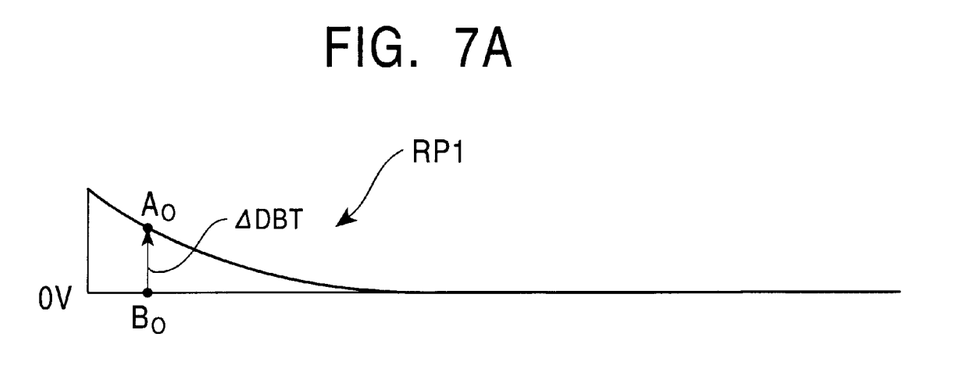
FIGS. 7A and 7B are enlarged views of portions PR1 and PR2 of FIGS. 6A and 6B, respectively.
Figure 7B:
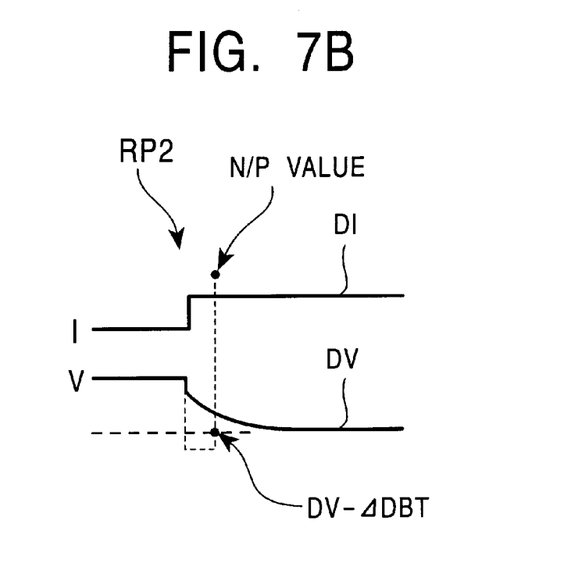

FIGS. 7A and 7B show enlargements of the portions PR1 and PR2 of FIGS. 6A and 6B, respectively.

If it is assumed that the correlation tables of FIGS. 5 and 8 are made so that they are referred to by a steady-state voltage (the portion of A) after polarization in FIG. 6A, at the voltage (the portion of B) when the polarized state is halfway, when the value of the reference voltage DBT is used to refer to B0 and A0, the voltage appears to be large by an amount corresponding to ΔDBT, and therefore, a high capacity appears if left as it is. Therefore, the reference voltage DBT can be obtained by subtracting the amount corresponding to the polarization voltage part ΔDBT from the measured terminal voltage DV of the secondary battery.

As shown in FIGS. 7A and 7B, the correct reference voltage DBT when referring to a table can be expressed as described below:

$$DBT = \text{the measured voltage } DV - \Delta DBT \qquad (7)$$

where

DBT is the voltage for referring to the correlation table,

DV is the terminal voltage of the secondary battery,

DI is the current during no load,

Dia is the moving average of the current,

N is the proportional constant (polarization voltage/voltage drop corresponding to internal resistance), and rr is the internal resistance of the secondary battery.

This ΔDBT corresponding to the amount of the polarization voltage is:

$$\Delta DBT = (DI - Dia) \times rr \times N \qquad (8)$$

In this embodiment, in FIGS. 6A and 6B, and 7A and 7B, by subtracting the polarization voltage ΔDBT, which is an adjustment-required part, from the measured voltage DV, it is possible to obtain the correctly determined reference voltage DBT for the correlation table. By using the reference voltage DBT obtained in this manner, it is possible to determine the capacity % of the secondary battery by using the corresponding correlation tables T2 to T4 of FIG. 8.

In an example in which the capacity is determined, by taking the change of the polarization voltage obtained from the moving average of the current value into consideration, equation (8) is obtained, and on the basis of the obtained voltage DBT, for example, the correlation table T2 of the voltage versus capacity of the secondary battery at a current DI (when the current is 0.5 A in FIG. 8) at that time can be referred to.

Also, if a particular current value does not coincide with the current DI in the voltage and capacity correlation table of the secondary battery, determined by a particular current value, interpolation is performed by using another voltage and capacity correlation table of a secondary battery, determined by a current value smaller than the current DI, and another voltage and capacity correlation table of a secondary battery, determined by a current value greater than the current DI, thus a voltage and capacity correlation table of the secondary battery can be obtained. Specifically, when particular current values are 0.5 A and 1 A as in FIG. 8, if the value of the actual current DI is 0.75 A, by performing interpolation using the correlation tables T2 and T3, a new correlation table TX having a correlation line L6 is obtained. As a result, the interpolated voltage–capacity correlation table at 0.75 A can be obtained.

Furthermore, in a voltage and capacity correlation table of a secondary battery, determined at a particular current value, when the current value does not coincide with the current DI, conversion into another voltage–capacity correlation table of a secondary battery, determined by a current value smaller than the current DI, or another voltage–capacity correlation table of a secondary battery, determined by a current value greater than the current DI may be performed so that the voltage and capacity correlation table of the secondary battery is referred to.

Specifically, when conversion (the table of DIy) into a correlation table of the smaller current value is performed, the reference voltage DBT of equation (6) becomes:

$$DBT = DV + (DI + Dia \times N) \times rr - (DIy + DIy \times N) \times rr \qquad (9)$$

Also, when conversion (the table of DIz) into a correlation table of the greater current value is performed, the reference voltage DBT of equation (6) becomes:

$$DBT = DV + (DI + Dia \times N) \times rr - (DIz + DIz \times N) \times rr \qquad (10)$$

As has been described, in the embodiments of the present invention, when the capacity in a secondary battery, such as a lithium-ion secondary battery, is computed by a voltage method, it is possible to enhance the measurement accuracy of capacity % by taking the effect due to the polarization voltage into consideration.

The type of battery is not limited to a lithium-ion secondary battery, and, other types, such as a NiCd battery, a polymer battery, and an air-zinc battery, may be used.

As has been described, according to the present invention, it is possible to accurately detect capacity by a voltage method by taking into consideration the polarization characteristics of a battery, such as a lithium-ion secondary battery.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A battery capacity detection method for detecting the capacity of a battery from a detected voltage of the battery on the basis of a correlation between the voltage of the battery and the capacity of said battery, said battery capacity detection method comprising the steps of:

a battery voltage detection step of detecting the voltage of a battery;

a battery voltage adjustment step of adjusting said detected voltage on the basis of the polarization characteristics possessed by a battery, and obtaining the adjusted battery voltage; and a battery capacity detection step of determining the capacity of said battery from said adjusted battery voltage on the basis of said correlation between the voltage of the battery and the capacity of said battery, wherein, said battery voltage adjustment step obtains said polarization characteristics by using the moving average of a current value of said battery.

2. A battery capacity detection method according to claim 1, wherein said battery voltage adjustment step determines said adjusted battery voltage in accordance with the following equation:

$$DBV=DV+(DI+Dia \times N) \times rr$$

where

DBV is the adjusted voltage,

DV is the terminal voltage of the battery,

DI is the current value of the battery,

Dia is the moving average of current,

N is the proportional constant (polarization voltage/voltage drop corresponding to internal resistance), and rr is the internal resistance of the battery.

3. A battery capacity detection method according to claim 1, wherein said correlation between the voltage of the battery and the capacity of said battery is a correlation between the voltage when the battery is loaded and the capacity of said battery, and said battery voltage adjustment step determines said adjusted battery voltage in accordance with the following equation:

$$DBT=DV-(DI-Dia) \times rr \times N$$

where

DBT is the adjusted voltage,

DV is the terminal voltage of the battery,

DI is the current value of the battery,

Dia is the moving average of current,

N is the proportional constant (polarization voltage/voltage drop corresponding to internal resistance), and rr is the internal resistance of the battery.

4. A battery capacity detection method according to claim 3, wherein said battery capacity detection step includes a selection step of selecting a correlation corresponding to the current value (DI) of said battery from a plurality of correlations between the voltage of said battery and the capacity of said battery, each correlation respectively corresponding to each of predetermined current values of the battery, and wherein the capacity of said battery is determined from said adjusted battery voltage on the basis of said selected correlation.

5. A battery capacity detection method according to claim 4, wherein said selection step includes a generation step of generating a correlation interpolated from said correlations when there is no such correlation corresponding to the current value (DI) of said battery, and wherein the capacity of said battery is determined from said adjusted battery voltage on the basis of said interpolated correlation.

6. A battery capacity detection method according to claim 5, wherein said generation step generates said interpolated correlation from a correlation corresponding to a current value, which is closest to said current value (DI) of said battery and which is smaller than the current value (DI) of said battery, and a correlation corresponding to a current value, which is closest to the current value (DI) of said battery and which is greater than the current value (DI) of said battery.

7. A battery capacity detection method according to claim 4, wherein said selection step readjusts said adjusted battery voltage to a voltage corresponding to one of said current values when there is no such correlation corresponding to the current value (DI) of said battery, and wherein the capacity of said battery is determined from said readjusted battery voltage on the basis of said correlation corresponding to said current value.

8. A battery pack for detecting the capacity of a battery from a detected voltage of the battery on the basis of a correlation between the voltage of the battery and the capacity of said battery, said battery pack comprising:

battery voltage detection means for detecting the voltage of a battery of said battery pack;

batter voltage adjustment means for adjusting said detected voltage on the basis of the polarization characteristics possessed by a battery and for obtaining the adjusted battery voltage; and battery capacity detection means for determining the capacity of said battery from said adjusted battery voltage on the basis of said correlation between the voltage of the battery and the capacity of said battery, wherein, said battery voltage adjustment means obtains said polarization characteristics by using the moving average of a current value of said battery.

9. A battery pack according to claim 8, further comprising display means for displaying the capacity of said battery.

10. A device powered by a battery pack which detects the capacity of a battery from a detected voltage of the battery on the basis of a correlation between the voltage of the battery and the capacity of said battery, said device comprising:

input means to which capacity information of said battery is input from said battery pack;

wherein said battery pack comprises:

battery voltage detection means for detecting the voltage of the battery of said battery pack;

battery voltage adjustment means for adjusting said detected voltage on the basis of the polarization characteristics possessed by a battery and for obtaining the adjusted battery voltage;

said battery voltage adjustment means obtains said polarization characteristics by using the moving average of a current value of said battery; and battery capacity detection means for determining the capacity of said batter from said adjusted battery voltage on the basis of said correlation between the voltage of the battery and the capacity of said battery.

11. The device of claim 10, wherein said battery pack further comprises display means for displaying the capacity of said battery.

* * * * *